(12) United States Patent
Lee et al.

(10) Patent No.: US 10,903,420 B2
(45) Date of Patent: Jan. 26, 2021

(54) LITHIUM-COMPOUND BASED SOLID STATE MEMRISTOR DEVICE FOR NEUROMORPHIC COMPUTING

(71) Applicant: INTERNATIONAL BUSINESS MACHINES CORPORATION, Armonk, NY (US)

(72) Inventors: Yun Seog Lee, Seoul (KR); Devendra K. Sadana, Pleasantville, NY (US); Joel P. de Souza, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 16/385,799

(22) Filed: Apr. 16, 2019

(65) Prior Publication Data
US 2020/0335693 A1    Oct. 22, 2020

(51) Int. Cl.
*H01L 45/00* (2006.01)

(52) U.S. Cl.
CPC ........ *H01L 45/085* (2013.01); *H01L 45/1233* (2013.01); *H01L 45/1253* (2013.01); *H01L 45/145* (2013.01); *H01L 45/147* (2013.01); *H01L 45/1608* (2013.01)

(58) Field of Classification Search
None
See application file for complete search history.

(56) References Cited

U.S. PATENT DOCUMENTS

| | | |
|---|---|---|
| 2009/0273887 A1 | 11/2009 | Elian |
| 2018/0247179 A1 | 8/2018 | Brew et al. |
| 2018/0260681 A1 | 9/2018 | de Souza et al. |
| 2018/0260694 A1 | 9/2018 | Bedell et al. |
| 2018/0260701 A1 | 9/2018 | Bedell et al. |
| 2018/0261764 A1 | 9/2018 | Bedell et al. |
| 2018/0277552 A1 | 9/2018 | Huang et al. |
| 2018/0294530 A1* | 10/2018 | de Souza .......... H01M 10/0525 |

OTHER PUBLICATIONS

Fuller et al., "Li-ion synaptic transistor for low power analog computing", Advanced Materials. vol. 29. Issue 4. Jan. 25, 2017. pp. 1-33.

Mai et al., "Memristive and neuromorphic behavior in a $Li_xCoO_2$ nanobattery", Scientific Reports. vol. 5, Issue 7761. Jan. 14, 2015. pp. 1-6.

(Continued)

*Primary Examiner* — Grant S Withers
(74) *Attorney, Agent, or Firm* — Tutunjian & Bitetto, P.C.; Randall Bluestone (57) ABSTRACT

A method is presented for obtaining a controllable resistance change in a battery-like device. The method includes depositing a first lithium-compound based layer in direct contact with a bottom electrode, depositing an electrolyte layer in direct contact with the first lithium-compound based layer, depositing a second lithium-compound based layer in direct contact with the electrolyte layer, forming a top electrode in direct contact with the second lithium-compound based layer, and applying electrical pulses between the top and bottom electrodes to trigger lithium ion transport to modify lithium concentrations in the first and second lithium-compound based layers.

7 Claims, 6 Drawing Sheets

(56) References Cited

OTHER PUBLICATIONS

Moradpour et al., "Resistive switching phenomena in LixCoO2 thin films", Advanced Materials. vol. 23, Issue 36. Sep. 22, 2011. pp. 4141-4145.
Nguyen et al., "Direct Evidence of Lithium Ion Migration in Resistive Switching of Lithium Cobalt Oxide Nanobatteries", Small Journal. vol. 14, Issue 24. Jun. 14, 2018. pp. 1-7.
Wang, et al., "Lithium Based Memristive Device", 2015 National Aerospace and Electronics Conference (NAECON). IEEE. Jun. 15-19, 2015. pp. 333-335.

* cited by examiner

LITHIUM-COMPOUND BASED SOLID STATE MEMRISTOR DEVICE FOR NEUROMORPHIC COMPUTING

BACKGROUND

The present invention relates generally to battery-like devices, and more specifically, to a lithium-compound based solid state memristor device for neuromorphic computing.

Memristors (memristive devices) have gained broad interest as a promising candidate for future data storage and efficient computing systems. At the device level, memristor-based memory offers high-density and fast on-chip storage and can help extend the lifetime of classical computing architectures based on Boolean logic. At the system level, a new class of analog/digital neuromorphic architectures have been developed, which can exploit the native physical properties of these resistive switching (RS) devices to directly and naturally implement brain-inspired computing paradigms, making memristor-based devices and systems highly attractive for efficiently processing data-intensive tasks at very low power in both the near term and the long term.

SUMMARY

In accordance with an embodiment, a method is provided for obtaining a controllable resistance change in a battery-like device. The method includes depositing a first lithium-compound based layer in direct contact with a bottom electrode, depositing an electrolyte layer in direct contact with the first lithium-compound based layer, depositing a second lithium-compound based layer in direct contact with the electrolyte layer, forming a top electrode in direct contact with the second lithium-compound based layer, and applying electrical pulses between the top and bottom electrodes to trigger lithium ion transport to modify lithium concentrations in the first and second lithium-compound based layers.

In accordance with another embodiment, a structure for obtaining a controllable resistance change is provided. The structure includes a first lithium-compound based layer disposed in direct contact with a bottom electrode, an electrolyte layer disposed in direct contact with the first lithium-compound based layer, a second lithium-compound based layer disposed in direct contact with the electrolyte layer, and a top electrode disposed in direct contact with the second lithium-compound based layer. Electrical pulses are applied between the top and bottom electrodes to trigger lithium ion transport to modify lithium concentrations in the first and second lithium-compound based layers.

In accordance with yet another embodiment, a structure for obtaining a controllable resistance change is provided. The structure includes a first cobalt oxide ($LiCoO_2$) layer disposed in direct contact with a bottom metallic electrode, an electrolyte layer disposed in direct contact with the first $LiCoO_2$ layer, a second $LiCoO_2$ layer disposed in direct contact with the electrolyte layer; and a top metallic electrode disposed in direct contact with the second $LiCoO_2$ layer. Electrical pulses are applied between the top and bottom metallic electrodes to modify lithium concentrations in the first and second $LiCoO_2$ layers.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide for a neuromorphic device for resistive random access memory (RRAM) based machine learning. The neuromorphic device includes a memristor device or memristor having a first lithium cobalt oxide ($LiCoO_2$) layer, an electrolyte layer, and a second $LiCoO_2$ layer positioned between a top electrode and a bottom electrode.

The exemplary embodiments of the present invention employ the cathode of a lithium ion battery to controllably change the lithium ion battery's resistance during charging and discharging events. Usually, a battery is employed for charging and discharging and no attention is paid to the resistance of the cathode of the battery. The cathode material (e.g., $LiCoO_2$) has a sharp increase in its resistance at a critical composition during charging (and discharging), which is controllable and desirable for RRAM type applications. The exemplary embodiments of the present invention allow for lithium ion transport under an applied voltage between the top and bottom electrodes, which can be used to change or modify or alter the lithium (Li) concentration in the $LiCoO_2$ layers, thereby changing the resistivity of the $LiCoO_2$ layers and enabling resistive switching behavior. In other words, the structure including the $LiCoO_2$ layers allows for a controllable resistance change to be obtained by an applied current or voltage pulse.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, Ge is used in combination with TiN. However, other combinations of materials can be readily contemplated.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

Figure 1:
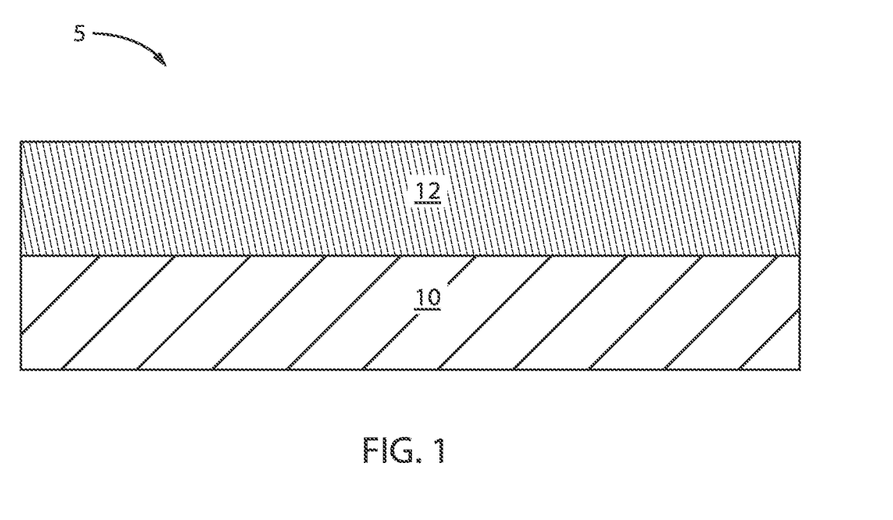
FIG. 1 is a cross-sectional view of a semiconductor structure where a bottom electrode is formed over a substrate, in accordance with an embodiment of the present invention.

FIG. 1 is a cross-sectional view of a semiconductor structure where a bottom electrode is formed over a substrate, in accordance with an embodiment of the present invention.

A semiconductor structure 5 includes a bottom electrode 12 formed over semiconductor substrate 10.

In one or more embodiments, the substrate 10 can be a semiconductor or an insulator, or a semiconductor with an active surface semiconductor layer, or a polymer based material. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate, a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The bottom electrode 12 can include a conductive material, such as Cu, Al, Ag, Au, Pt, W, etc. In some embodiments, the bottom electrode 12 can include nitrides such as Ti, TiN, Ta, TaN or Ru. In another example, the bottom electrode 12 can be, e.g., Ni.

Figure 2:
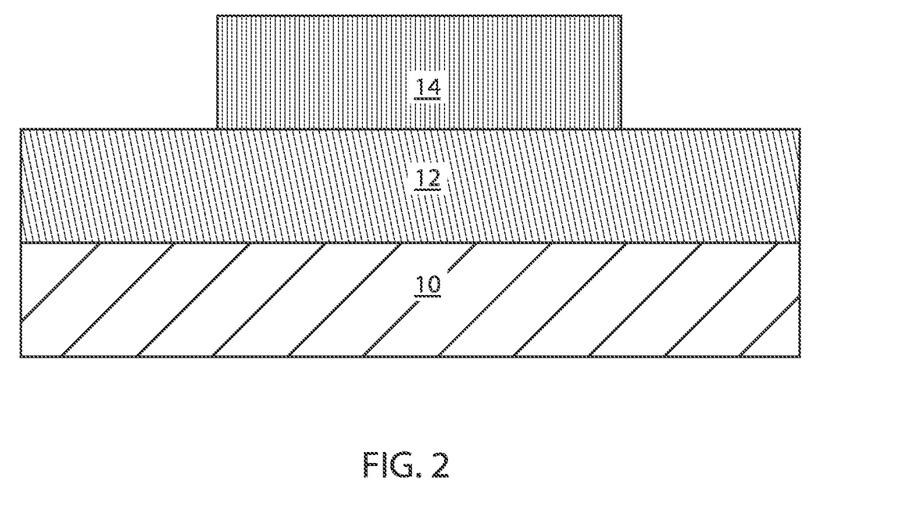
FIG. 2 is a cross-sectional view of the semiconductor structure of FIG. 1 where a first lithium-compound based layer is deposited over the bottom electrode, in accordance with an embodiment of the present invention.

FIG. 2 is a cross-sectional view of the semiconductor structure of FIG. 1 where a first lithium-compound based layer is deposited over the bottom electrode, in accordance with an embodiment of the present invention.

In various example embodiments, a first lithium-compound based layer 14 is deposited over the bottom electrode 12. The first lithium-compound based layer 14 can be, e.g., a lithium cobalt oxide ($LiCoO_2$) layer.

$LiCoO_2$ is one of the most important cathode materials in Li-ion batteries (LIB). Because the battery performance of LIB s is strongly derived from the cathode material, the properties of $LiCoO_2$ particles used as a cathode material are important. For example, the density and the particle size distribution as well as a minimized amount of impurities of the particles are factors affecting, for example, the size as well as the safety of LIBs. Synthesis of $LiCoO_2$ particles includes sintering a cobalt oxide or hydroxide precursor and a lithium salt at high temperatures (1000° C.) in air with the presence of the excess lithium salt.

Figure 3:
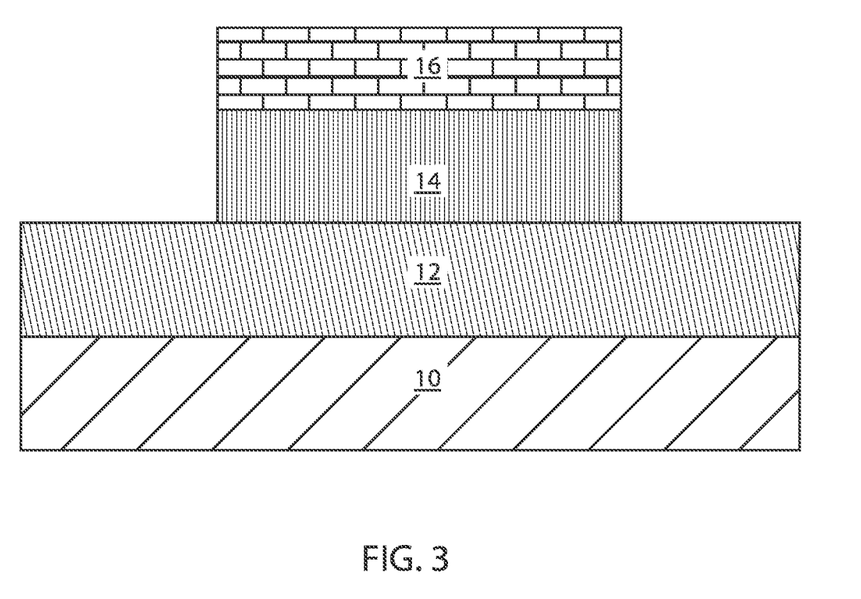
FIG. 3 is a cross-sectional view of the semiconductor structure of FIG. 2 where an electrolyte layer is deposited over the first lithium-compound based layer, in accordance with an embodiment of the present invention.

FIG. 3 is a cross-sectional view of the semiconductor structure of FIG. 2 where an electrolyte layer is deposited over the first lithium-compound based layer, in accordance with an embodiment of the present invention.

In various example embodiments, an electrolyte layer 16 is deposited over the first lithium-compound based layer 14. The electrolyte layer 16 can be e.g., a lithium phosphorous oxynitride (LiPON) layer.

Figure 4:
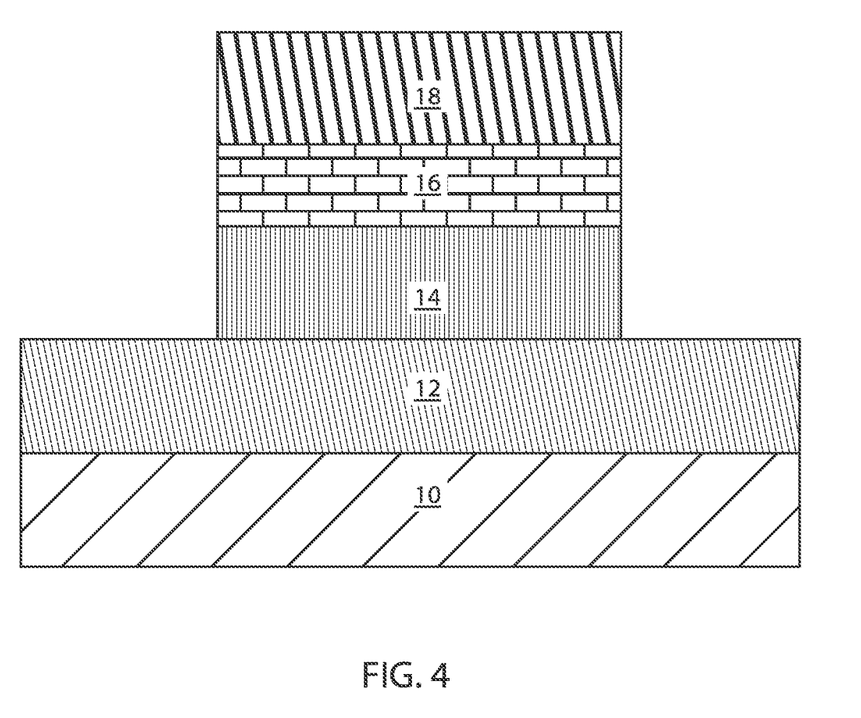
FIG. 4 is a cross-sectional view of the semiconductor structure of FIG. 3 where a second lithium-compound based layer is deposited over the electrolyte layer, in accordance with an embodiment of the present invention.

FIG. 4 is a cross-sectional view of the semiconductor structure of FIG. 3 where a second lithium-compound based layer is deposited over the electrolyte layer, in accordance with an embodiment of the present invention.

In various example embodiments, a second lithium-compound based layer 18 is deposited over the electrolyte layer 16. The second lithium-compound based layer 18 can be, e.g., a lithium cobalt oxide ($LiCoO_2$) layer. In one example, the first lithium-compound based layer 14 can be constructed from the same material as the second lithium-compound based layer 18.

Figure 5:
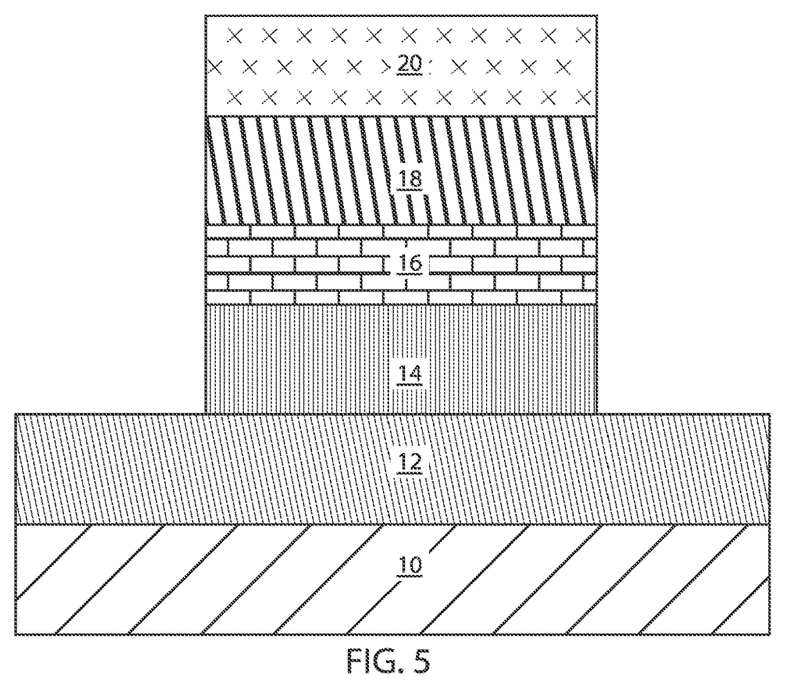
FIG. 5 is a cross-sectional view of the semiconductor structure of FIG. 4 where a top electrode is formed over the second lithium-compound based layer, in accordance with an embodiment of the present invention.

FIG. 5 is a cross-sectional view of the semiconductor structure of FIG. 4 where a top electrode is formed over the second lithium-compound based layer, in accordance with an embodiment of the present invention.

In various example embodiments, a top electrode 20 is formed over the second lithium-compound based layer 18 to complete the memristor device or memristor.

The top electrode 20 can include a conductive material, such as Cu, Al, Ag, Au, Pt, W, etc. In some embodiments, the top electrode 20 can include nitrides such as Ti, TiN, Ta, TaN or Ru. In another example, the top electrode 20 can be, e.g., Ni.

Memristors are by definition two-terminal systems that show resistive switching (RS) effects. From a material and device point of view, the RS effect can be attributed to different switching mechanisms. In particular, redox-based memristors, which are often called resistive random-access-memory (RRAM) devices for memory applications have been employed. These devices are generally simple in structure and nanoscale in dimensions (e.g., scaling <10 nm), while at the same time offering excellent performance in terms of switching speed, retention, and write/erase cycling.

In a conventional device, the resistance state can be reversely switched from a high-resistance state (HRS) to a low-resistance state (LRS) during the SET process, when the bias voltage is above the SET threshold voltage. The device will maintain the new resistance value, and thus can store the data in a non-volatile fashion, until it goes through a RESET process where the resistance can be switched back to the HRS, and vice versa. In general, RRAM devices are fabricated in a metal-insulator-metal (MIM) structure, with two metal electrodes sandwiching a thin film dielectric layer. Due to its nanoscale thickness, the dielectric layer can act as a solid electrolyte that accommodates cation or anion re-distribution within it, since at these dimensions even moderate voltage drops can create significant electric fields that exponentially speed up the ionic oxidation, migration and reduction processes. These processes in turn lead to the creation or annihilation of a conductive filament in the switching layer, and consequently the RS effects.

In contrast, in the present device, the metal-insulator-metal (MIM) structure has been modified by incorporating a first $LiCoO_2$ layer 14, an electrolyte layer 16, and a second $LiCoO_2$ layer 18 between the bottom electrode 12 and the top electrode 20. This structure allows for lithium ion transport under an applied voltage between the electrodes 12, 20 and can be used to change the lithium (Li) concentration in the $LiCoO_2$ layers 14, 18, thereby changing the resistivity in the $LiCoO_2$ layers 14, 18 and enabling resistive switching behavior. In other words, a controllable resistance change can be obtained by an applied current or voltage pulse. The resistance change of the $LiCoO_2$ layers 14, 18 or the $LiCoO_2$ cathode during intercalation by external current or voltage pulses is depicted in FIG. 6 below.

Stated differently, the structure uses the cathode of a lithium ion battery to controllably change its resistance during charging and discharging events. Usually, a battery is used for charging and discharging for its operation and no attention is paid to the resistance of the battery's cathode. The cathode material (e.g., $LiCoO_2$) has a sharp increase in its resistance at a critical composition during charging (and discharging), which is controllable and desirable for RRAM type applications. The structure including the Li-containing cathode material on both sides of an electrically insulating, but ionically conducting electrolyte layer allows for a controllable change in the cathode resistance when external current or voltage pulses are applied between the top and bottom electrodes.

Thus, the advantages of employing the structure of FIG. 5 include but are not limited to the fact that resistance can be changed symmetrically in both positive and negative directions, multiple resistance states can be accomplished by applying current pulses to the device, the resistance state can be maintained for a prolonged period (e.g., several months), long endurance (thousands of cycle) of the device, and simple fabrication for manufacturability.

Figure 6:
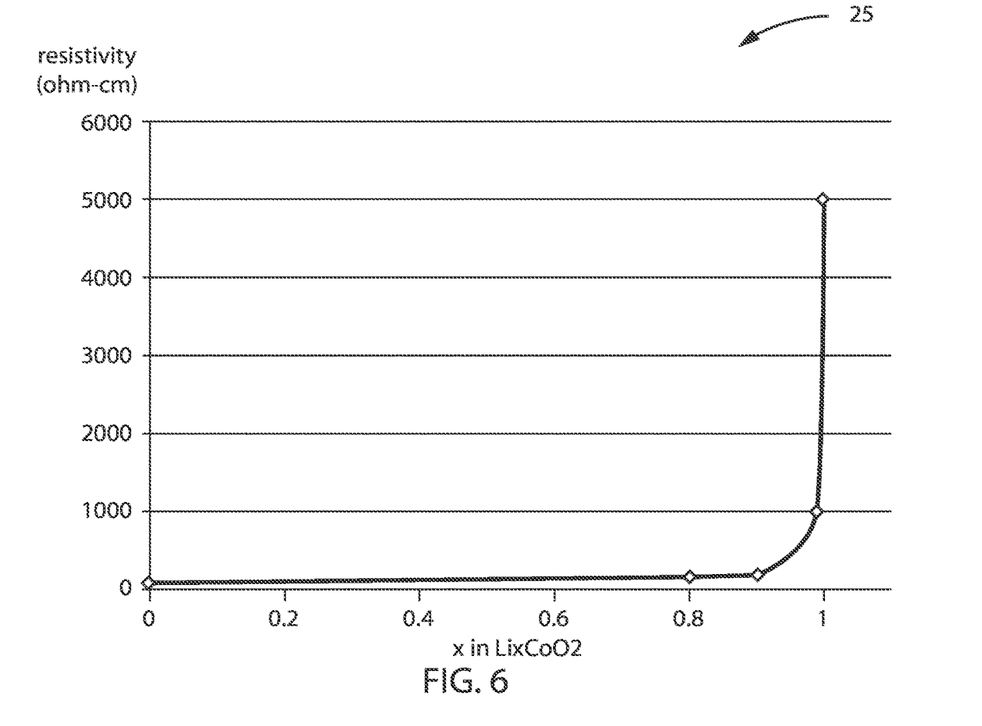
FIG. 6 is an exemplary graph illustrating resistivity change of lithium cobalt oxide ($LiCoO_2$), in accordance with an embodiment of the present invention.

FIG. 6 is an exemplary graph illustrating resistivity change of lithium cobalt oxide ($LiCoO_2$), in accordance with an embodiment of the present invention.

Graph 25 illustrates resistivity change of lithium cobalt oxide ($LiCoO_2$). In other words, the resistance change of the $LiCoO_2$ cathode is depicted during intercalation by external current or voltage pulses.

Graph 25 illustrates Li-composition induced resistance change. Moreover, Li-rich $Li_xCoO_2$ layer ($0.8<x<1$) dominates total resistance of the device. In one example, the process can be set by a long pulse signal, such that lithium (Li) migration (ionic conduction) occurs between the first $LiCoO_2$ layer 14 and the second $LiCoO_2$ layer 18. The process is read by a short pulse signal, where electric conduction without Li-migration is employed.

Figure 7:
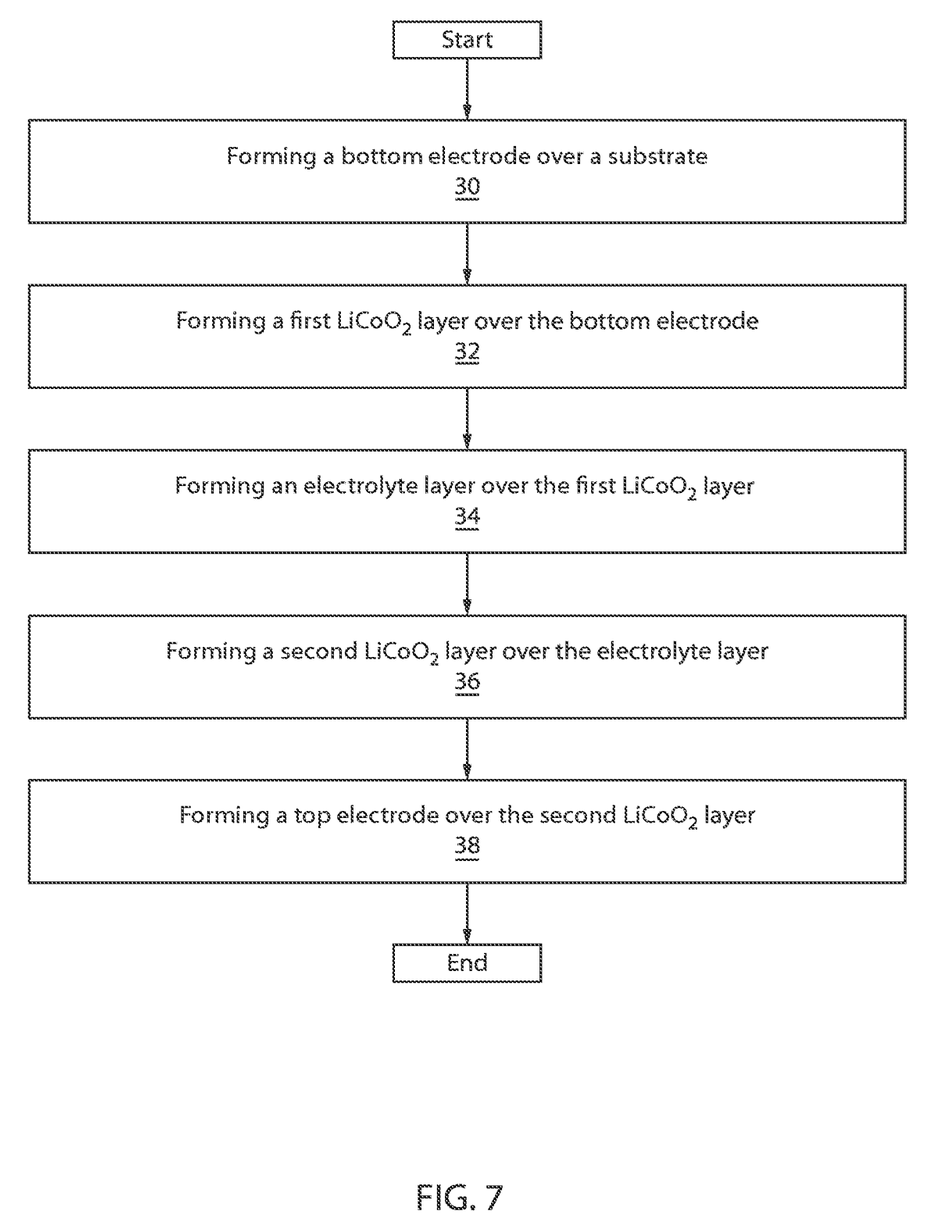
FIG. 7 is a block/flow diagram of an exemplary method for constructing the memristor device of FIG. 5, in accordance with an embodiment of the present invention.

FIG. 7 is a block/flow diagram of an exemplary method for constructing the memristor device of FIG. 5, in accordance with an embodiment of the present invention.

At block 30, a bottom electrode is formed over a substrate. The bottom electrode can be, e.g., Ti, Ta, or Ni.

At block 32, a first $LiCoO_2$ layer is formed over the bottom electrode.

At block 34, an electrolyte layer is formed over the first $LiCoO_2$ layer. The electrolyte layer can be, e.g., a lithium phosphorous oxynitride (LiPON) layer.

At block 36, a second $LiCoO_2$ layer is formed over the electrolyte layer.

At block 38, a top electrode is formed over the second $LiCoO_2$ layer. The top electrode can be, e.g., Ti, Ta, or Ni.

Figure 8:
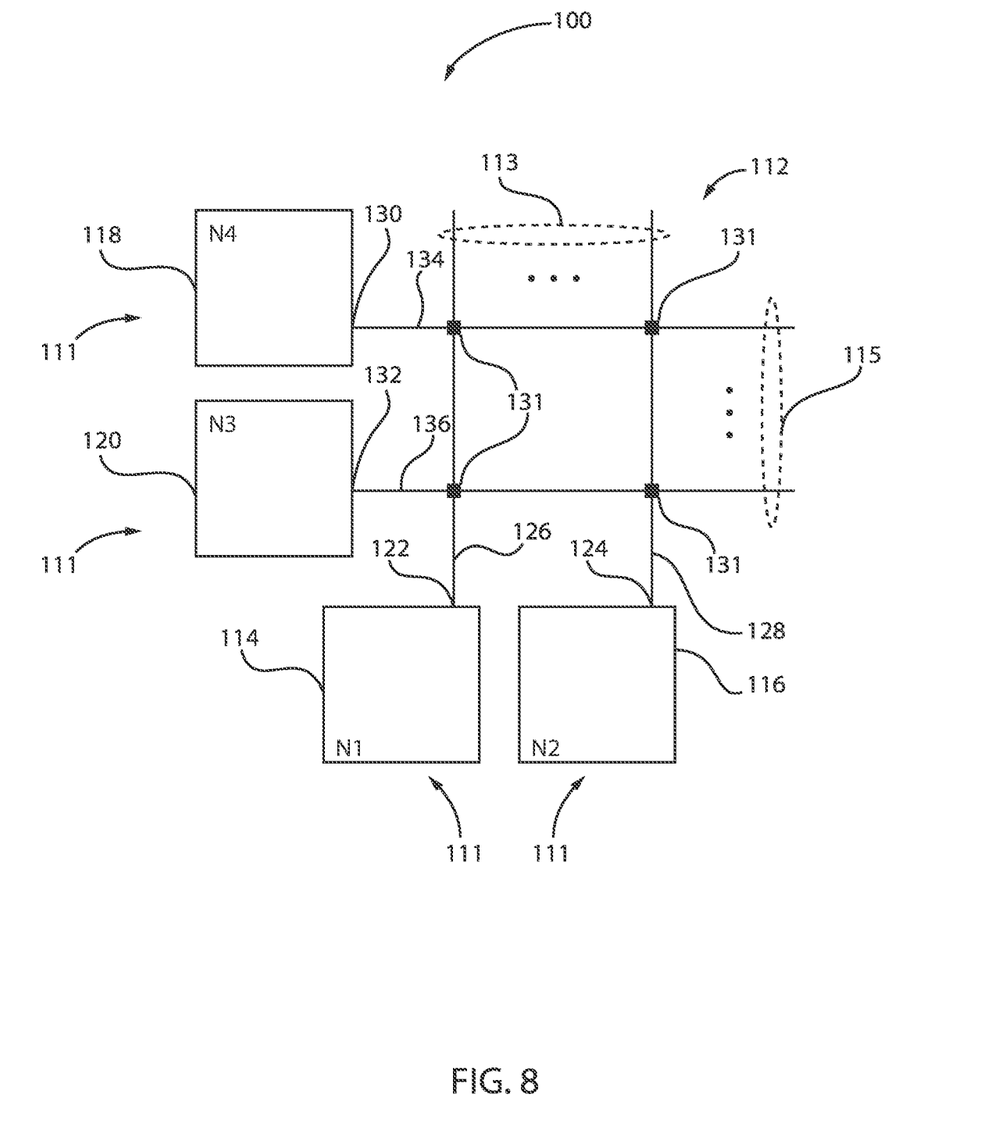
FIG. 8 is a block/flow diagram of an exemplary neuromorphic and synaptronic network including a crossbar of electronic synapses interconnecting electronic neurons and axons, in accordance with an embodiment of the present invention.

FIG. 8 is a block/flow diagram of an exemplary neuromorphic and synaptronic network including a crossbar of electronic synapses interconnecting electronic neurons and axons, in accordance with an embodiment of the present invention.

The example tile circuit 100 has a crossbar 112 in accordance with an embodiment of the invention. In one example, the overall circuit can include an "ultra-dense crossbar array" that can have a pitch in the range of about 0.1 nm to 10 μm. The neuromorphic and synaptronic circuit 100 includes the crossbar 112 interconnecting a plurality of digital neurons 111 including neurons 114, 116, 118 and 120. These neurons 111 are also referred to herein as "electronic neurons." For illustration purposes, the example circuit 100 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 100, the neurons 111 are connected to the crossbar 112 via dendrite paths/wires (dendrites) 113 such as dendrites 126 and 128. Neurons 111 are also connected to the crossbar 112 via axon paths/wires (axons) 115 such as axons 134 and 136. Neurons 114 and 116 are dendritic neurons and neurons 118 and 120 are axonal neurons connected with axons 113. Specifically, neurons 114 and 116 are shown with outputs 122 and 124 connected to dendrites (e.g., bitlines) 126 and 128, respectively. Axonal neurons 118 and 120 are shown with outputs 130 and 132 connected to axons (e.g., wordlines or access lines) 134 and 136, respectively.

When any of the neurons 114, 116, 118 and 120 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 126, 128 and axons 134, 136 are made through a digital synapse device 131 (synapse). The junctions where the synapse devices are located can be referred to herein as "cross-point junctions." In general, in accordance with an embodiment of the invention, neurons 114 and 116 will "fire" (transmit a pulse) in response to the inputs they receive from axonal input connections (not shown) exceeding a threshold.

Neurons 118 and 120 will "fire" (transmit a pulse) in response to the inputs they receive from external input connections (not shown), usually from other neurons, exceeding a threshold. In one embodiment, when neurons 114 and 116 fire they maintain a postsynaptic-STDP (post-STDP) variable that decays. For example, in one embodiment, the decay period can be 50 ms. The post-STDP variable is used to achieve STDP by encoding the time since the last firing of the associated neuron. Such STDP is used to control long-term potentiation or "potentiation," which in this context is defined as increasing synaptic conductance. When neurons 118, 120 fire they maintain a pre-STDP (presynaptic-STDP) variable that decays in a similar fashion as that of neurons 114 and 116.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 111 implemented using complementary metal oxide semiconductor (CMOS) logic gates receive spike inputs and integrate them. In one embodiment, the neurons 111 include comparator circuits that generate spikes when the integrated input exceeds a threshold. In one embodiment, binary synapses are implemented using transposable 1-bit static random-access memory (SRAM) cells, wherein each neuron 111 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 9:
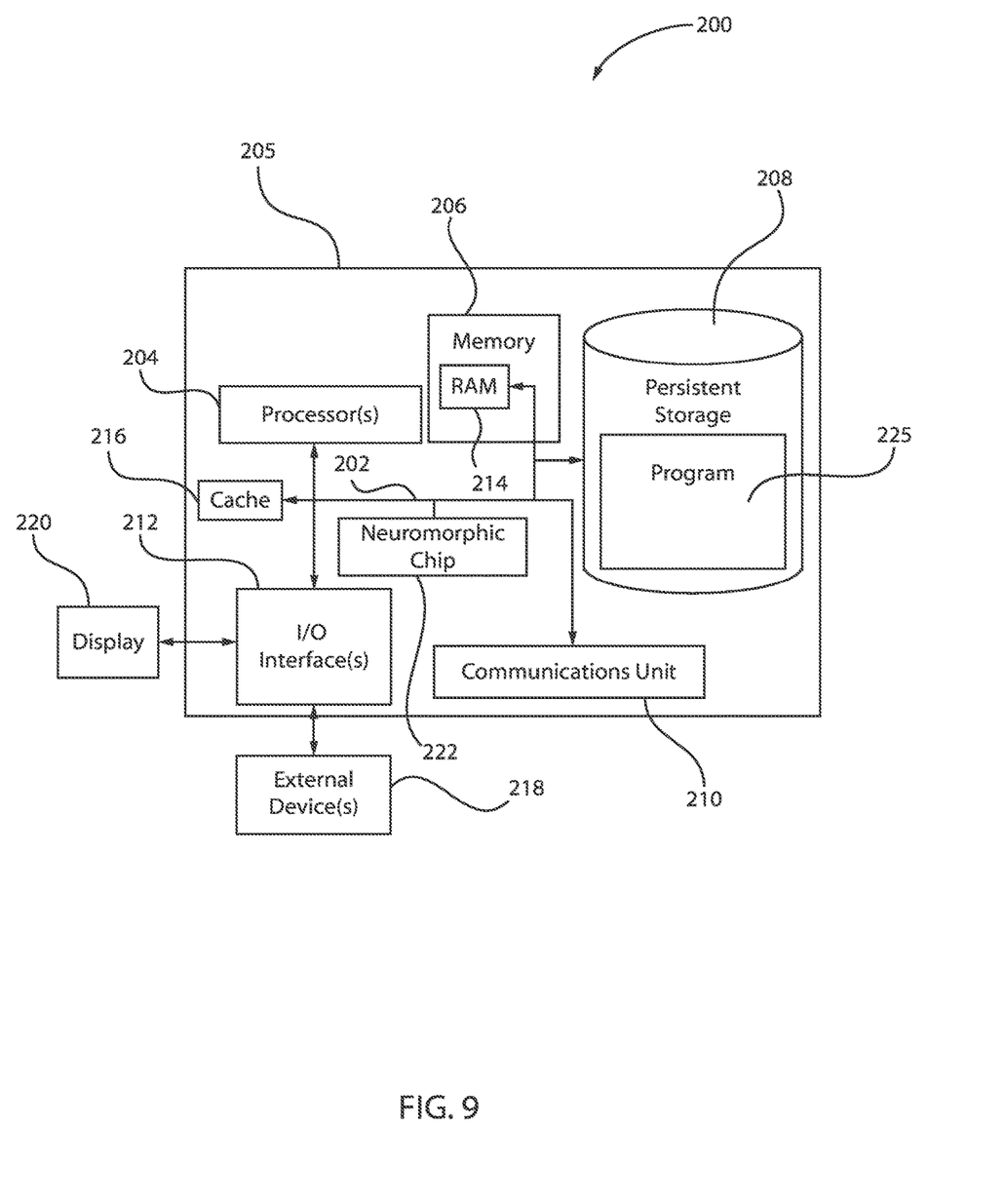
FIG. 9 depicts a block diagram of components of a computing system including a computing device and a neuromorphic chip capable of operationally performing deep learning sampling, in accordance with an embodiment of the present invention.

FIG. 9 depicts a block diagram of components of a computing system including a computing device and a neuromorphic chip capable of operationally performing deep learning sampling, in accordance with an embodiment of the present invention.

FIG. 9 depicts a block diagram of components of system 200, which includes computing device 205. It should be appreciated that FIG. 9 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. In general, memory 206 can include any suitable volatile or non-volatile computer readable storage media.

In some embodiments of the present invention, deep learning program 225 is included and operated by neuromorphic chip 222 as a component of computing device 205. In other embodiments, deep learning program 225 is stored in persistent storage 208 for execution by neuromorphic chip 222 in conjunction with one or more of the respective computer processors 204 via one or more memories of memory 206. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

In some embodiments of the present invention, neuromorphic chip 222 is included in computing device 205 and connected to communications fabric 202. Neuromorphic chip 222 includes electronic logic to provide stacked restricted Boltzmann machines, and a feed forward neural network, including deep learning algorithmic components that are trainable and perform machine learning. In other embodiments, the logistical and algorithmic components operations are performed by specialized data structures, included within computing device 205, which perform the deep learning functions of the stacked restricted Boltzmann machines, and feed forward neural network.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Deep learning program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including,"

when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and device for obtaining a controllable resistance change by an applied current or voltage pulse (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for obtaining a controllable resistance change in a battery-like device, the method comprising:
   depositing a first lithium-compound based layer in direct contact with a bottom electrode;
   depositing an electrolyte layer in direct contact with the first lithium-compound based layer;
   depositing a second lithium-compound based layer in direct contact with the electrolyte layer;
   forming a top electrode in direct contact with the second lithium-compound based layer; and
   applying electrical pulses between the top and bottom electrodes to trigger lithium ion transport to modify lithium concentrations in the first and second lithium-compound based layers.

2. The method of claim 1, wherein the first lithium-compound based layer is constructed from a same material as the second lithium-compound based layer.

3. The method of claim 1, wherein the first and second lithium-compound based layers are lithium cobalt oxide ($LiCoO_2$) layers.

4. The method of claim 1, wherein the electrolyte layer is a lithium phosphorous oxynitride (LiPON) layer.

5. The method of claim 1, wherein the lithium ion transport modifies a resistivity of the first and second lithium-compound based layers.

6. The method of claim 5, wherein modification of the resistivity enables control of a resistive switching behavior of the battery-like device.

7. The method of claim 5, wherein the resistivity is symmetrically changed in both positive and negative directions.

* * * * *